(12) United States Patent
Besser et al.

(10) Patent No.: US 6,258,683 B1
(45) Date of Patent: Jul. 10, 2001

(54) LOCAL INTERCONNECTION ARRANGEMENT WITH REDUCED JUNCTION LEAKAGE AND METHOD OF FORMING SAME

(75) Inventors: Paul Besser, Austin, TX (US); Simon S. Chan, Saratoga; Yowjuang Bill Liu, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/477,741

(22) Filed: Jan. 5, 2000

Related U.S. Application Data

(60) Provisional application No. 60/149,479, filed on Aug. 19, 1999.

(51) Int. Cl.[7] .......................... H01L 21/336; H01L 21/44; H01L 21/4763; H01L 21/302; H01L 21/461

(52) U.S. Cl. .......................... 438/306; 438/598; 438/618; 438/740

(58) Field of Search ................................. 438/306, 598, 438/618, 740

(56) References Cited

U.S. PATENT DOCUMENTS 6,180,475 * 1/2001 Cheek et al. .
6,201,303 * 3/2001 Ngo et al. .

* cited by examiner

Primary Examiner—John F. Niebling
Assistant Examiner—Josetta Jones

(57) ABSTRACT

A method and arrangement for forming a local interconnect without etching completely through a junction and causing device shorts introduces an additional ion implantation step following the etching of the local interconnect opening into the substrate. The additional ion implantation step into the active region ensures that the depth of the junction is below the depth reached by the local interconnect opening and the substrate.

6 Claims, 4 Drawing Sheets

# LOCAL INTERCONNECTION ARRANGEMENT WITH REDUCED JUNCTION LEAKAGE AND METHOD OF FORMING SAME

RELATED APPLICATIONS

This application contains subject matter related to the subject matter disclosed in copending U.S. Provisional Patent Application Serial No. 60/149,479, filed on Aug. 19, 1999.

FIELD OF THE INVENTION

The present invention relates to the formation of local interconnects and semiconductor processing technology, and more particularly, to the reduction of junction leakage caused by the attack of a shallow trench isolation (STI) interface with silicon during contact etching

BACKGROUND OF THE INVENTION

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected. To accomplish interconnection on such a small scale, a local interconnect is typically used within an integrated circuit to provide an electrical connection between two or more conducting or semiconducting regions (e.g. active regions of one or more devices). For example, a plurality of transistors can be connected to form an inverting logical circuit using local interconnects.

The local interconnect is typically a relatively low resistance material, such as a conductor or a doped semiconductor, that is formed to electrically couple the selected regions. For example, in certain arrangements, damascene techniques are used to provide local interconnects made of Tungsten (W), or other conductor, which is deposited within an etched opening, such as a via or a trench that connects the selected regions together. The use of local interconnects reduces the coupling burden of the subsequently formed higher layers to provide such connectivity, which reduces the overall circuit size and as such tends to increase the circuit's performance. Accordingly, as the density of the circuits increases there is a continuing need for more efficient, effective, and precise processes for forming smaller local interconnects.

A problem arises in the formation of a local interconnect due the relatively poor etch selectivity of an oxide dielectric material to the etch stop layer typically used to prevent over-etching into a diffusion region. The over-etching may lead to disconnection of the diffusion region at a field edge and result in a poor interconnection. Ibis may best be understood by reference to FIGS. 1–3 to illustrate the concern.

FIG. 1 depicts a cross-section of a semiconnector device arrangement during one step of a local interconnect formation process. A silicon substrate 10 has polycrystalline silicon (hereafter polysilicon) gates 12 and 14 formed thereon. The polysilicon gate 14 is actually formed on the field oxide 16. The spacer 15 (such as an oxide spacer) provides a shielding of the substrate 10 directly under the spacer 15 during implantation or diffusion of doping substrate 10.

A plurality of silicide regions 18 are formed through conventional suicide techniques, for example, in a self-aligned silicide ("salicide") technique. The material comprising the silicide regions 18 may be selected from different materials, such as titanium silicide, cobalt silicide, tungsten silicide, etc. silicide regions 18 provide a low resistant contact for the semiconductor devices.

The doped active region 20 is provided in the substrate 10 as defined by the doping. Typically, a heating step is performed to activate the dopants following the introduction of the dopants into the substrate 10. The depth of the active region 20 in the substrate 10 is determined by the implantation energy employed to implant the dopant ions into the substrate 10 and the activation anneal.

An etch stop layer 22 is conformally deposited over the semiconductor wafer. An exemplary material for the etch stop layer is silicon oxynitride (SiON) and a conventional method of deposition is plasma-enhanced chemical vapor deposition (PECVD). The layer of dielectric material, such as, silicon dioxide derived from tetraethyl orthosilicate (TEOS), is deposited over the etch stop layer 22 and planarized. The dialectic layer 24 is then covered with a photoresist mask 26 which is patterned and developed with a desired local interconnect opening that is to be etched in the dielectric layer 24. In this example of FIG. 1, the opening in the photoresist layer is positioned to provide a local interconnect opening in the dielectric layer 24 that will eventually connect the gate 14 of one device with an active region 20 of another device.

An etching step is then performed that etches through the dielectric layer 24 in accordance with the pattern in the photoresist layer 26. It is desirable to stop this first etching step at the etch stop layer 22. However, as depicted in FIG. 2, it often difficult to precisely stop the etch on the etch stop layer 22, especially at the edge of the field 16. In this circumstance, the local interconnect opening 28 undesirably extends into the substrate 10 at area 30. The unintended etching through the etch stop layer 22 allows the etching to etch the silicide region 18 and the diffusion region 20, creating the dip 30 into the substrate 10.

As seen in FIG. 3, after the deposition of a liner (or "barrier layer") that prevents diffusion of the conductive material into the other areas of the device, the local interconnect opening 28 is filled with a conductive material, such as tungsten 34. However, the attack of the shallow trench isolation (STI) interface with the silicon during the contact etching leads to junction leakage. The junction leakage decreases the performance of the circuit, and in extreme circumstances, may cause circuit failure.

There is a need for an improved method of forming a local interconnect arrangement with a semiconductor device, and an improved method for performing the local interconnect arrangement with the semiconductor device to reduce or eliminate junction leakage.

SUMMARY OF THE INVENTION

This and other needs are met by the present invention which provides a method of forming a local interconnect comprising the steps of implanting ions in a semiconductor substrate to form active regions within the substrate. A dielectric layer is deposited over the substrate. The dielectric layer is then etched in accordance with a desired pattern to form a local interconnect opening. Additional ions are implanted within the semiconductor substrate to thereby enlarge the active regions. Conductive material is then deposited in a local interconnect opening.

By enlarging the active regions through implanting of additional ions within a semiconductor substrate, the junction depth can be increased so that it is deeper than the depth reached by the contact or local interconnect etch. Since the junction is deeper than the etch into the substrate, yield is increased and shorting of the device to the substrate is prevented.

The earlier stated needs are also met by another embodiment of the present invention which provides a local interconnect arrangement comprising a substrate layer, and a semiconductor device formed on the substrate. The semiconductor device has junctions formed within the substrate. A dielectric layer is provided on a substrate layer and on the semiconductor device. A local interconnect opening extends through the dielectric layer to the junctions, and conductive material fills this local interconnect opening. The junctions include a first set of ions implanted to a first depth into the substrate, as well as a second set of ions implanted to a second depth into the substrate. The second depth is greater than the first depth. The second depth is also greater than the depth of the local interconnect opening into the substrate.

The local interconnect arrangement of the present invention prevents a shorting of the device to the substrate, even if the contact etch has extended into the substrate more deeply than desired. This is because the second set of ions implanted to the second depth assures that the junction extends below the deepest part of the contact etch.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DETAILED DESCRIPTION OF THE INVENTION

The present invention addresses and alleviates the problem of junction leakage created by a contact etch for local interconnect formation that attacks the shallow trench isolation (STI) interface with silicon. The improvement is achieved in the present invention by performing an additional implantation step prior to the deposition of the conductive material in the local interconnect opening. By performing the implantation step after the etching of the local interconnect opening, it can ensured that the junction will be deeper than the local interconnect etch area. Since the junction depth is greater than the depth of the contact etch, the yield is increased and shorts of the device to the substrate are avoided.

Figure 4:
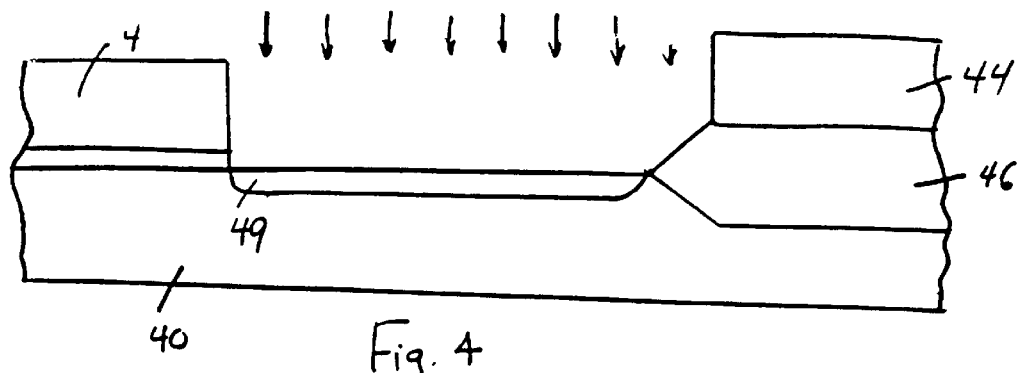
FIG. 4 is a cross-section of a portion of a semiconductor wafer during a step of the manufacturing process in accordance with an embodiment of the present invention.

FIG. 4 depicts the cross-section of a portion of a semiconductor wafer during one step of a manufacturing process in accordance with embodiments of the present invention. A substrate 40, made of silicon, for example, has a polysilicon gate 42 formed over a gate oxide. A lightly doped diffusion region 49 is formed in the substrate 40 by conventional doping techniques (e.g. ion implantation). A field region 46 isolates the device on the left-hand side of FIG. 4 from other devices in the wafer. A polysilicon gate 44 or interconnect is formed on the field oxide 46.

Figure 5:
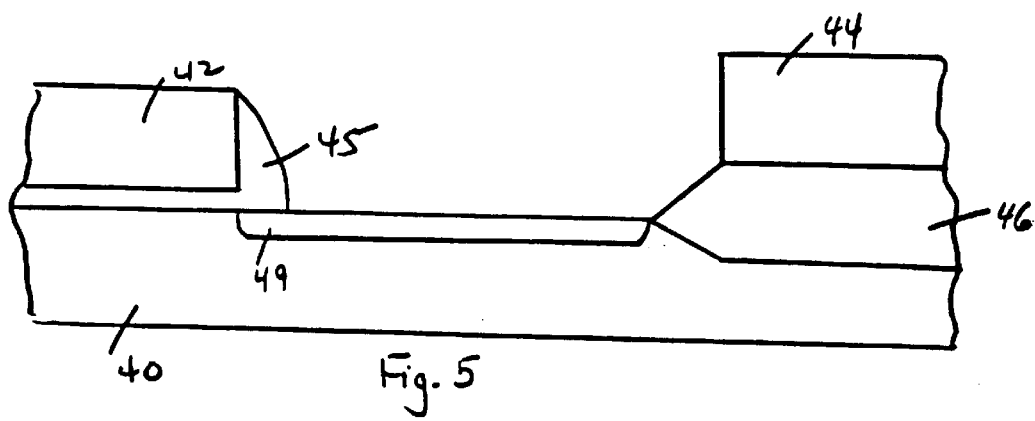
FIG. 5 depicts the cross-section of the portion of FIG. 4 following the formation of a sidewall spacer on the side of a gate in accordance with an embodiment of the present invention.

FIG. 5 depicts the cross-section of the semiconductor wafer of FIG. 4 after a sidewall spacer 45 has been formed. The sidewall spacer 45 may be made of oxide, or silicon nitride, for example, and is formed in a conventional manner on the walls of the polysilicon gate 42. The intermediate steps for forming the spacer sidewall 45, including deposition of the spacer material and subsequent etching, are not depicted but are well known to those of skill in the art.

Ion implantation is then performed in the active region 49 to increase the depth of the active region, indicated by reference numeral 50. This has the effect of deepening the junctions 50. The sidewall spacer 45 acts to prevent implantation in the silicon substrate of the ions during this implantation step. The ions may be any type of ion conventionally used in doping a semiconductor substrate. For example, boron or phosphorous may be employed as the dopants.

In the preferred embodiments of the present invention, the implantation energy to implant this first set of ions is between about 20 and 60 KeV. This has the effect of doping the substrate in the active region 50 to a depth between about 1000 and about 2000 Angstroms. This is a depth that is conventionally employed for junctions in typical devices and interconnect arrangements.

Figure 6:
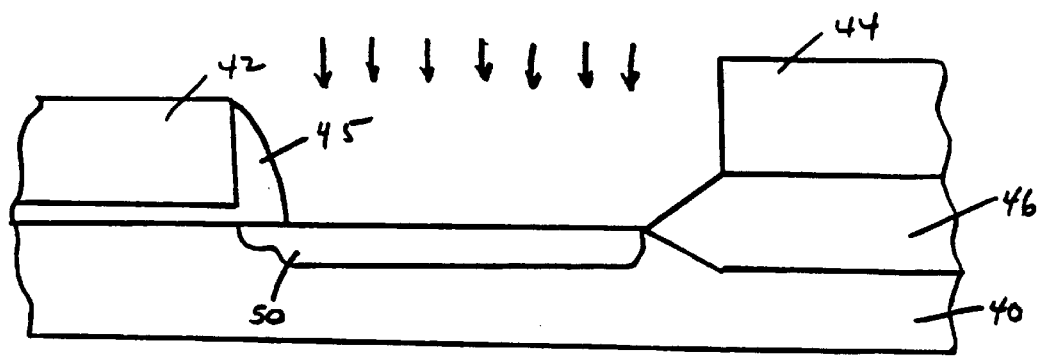
FIG. 6 is a cross-section of the portion of FIG. 5 following the implantation of ions into the junctions or active regions in accordance with embodiments of the present invention.
Figure 7:
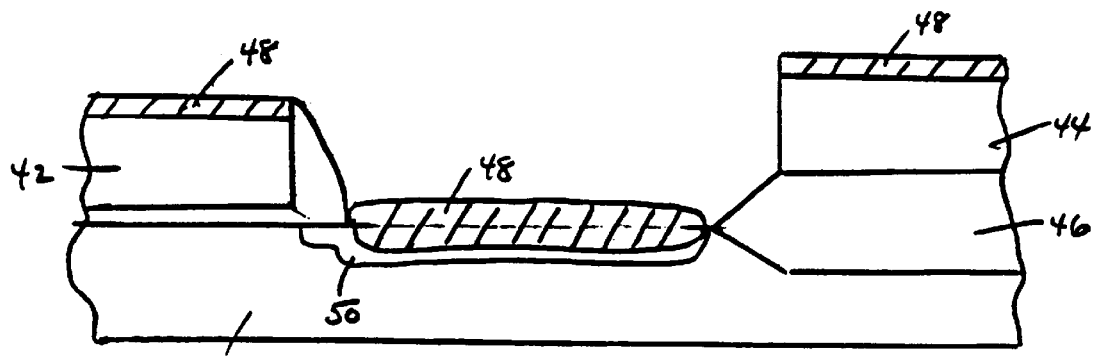
FIG. 7 is a cross-section of the portion of FIG. 6 after the formation of silicide regions on the exposed silicon and polysilcon areas in accordance with an embodiment of the present invention.

FIG. 7 depicts the portion of the semiconductor wafer of FIG. 6 after silicide regions 48 are formed on the gates 42, 44 and the junction 50. The silicide region 48 may be formed in any number of different manners. The conventional manner of forming the silicide region 48 involves depositing a refractory metal layer over the wafer. This refractory metal layer may be titanium, cobalt, nickel, etc. After a series of annealing steps, e.g., first and second annealing steps, a low resistivity phase silicide is formed where the refractory metal layer interfaces with the silicon or polysilicon. These techniques are well understood and therefore are not illustrated in detail, so that only the resulting silicide region 48 is shown in FIG. 7.

Figure 8:
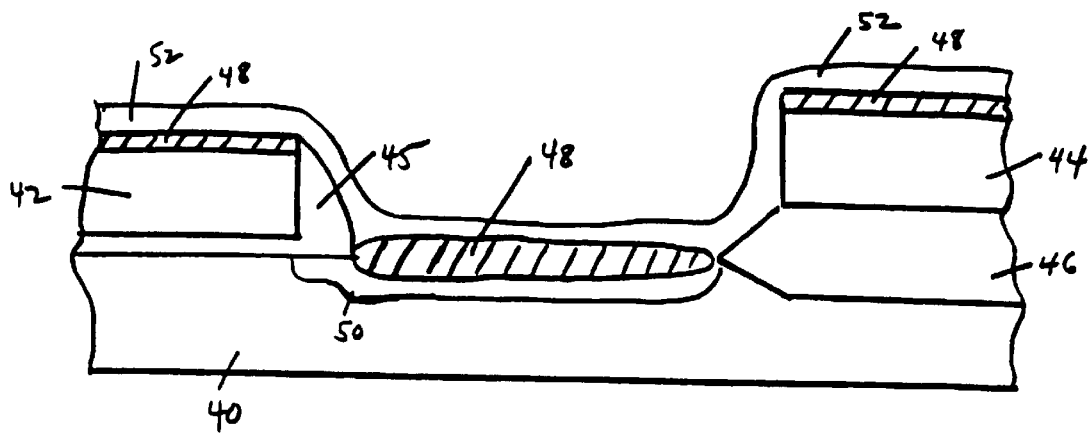
FIG. 8 is a cross-section of the portion of FIG. 7 following the deposition of an etch stop layer in accordance with an embodiment of the present invention.

In FIG. 8, an etch stop layer 52 is provided over the wafer. The etch stop layer 52 serves to help control the etch process when the contact or local interconnect opening is etched in subsequent steps. The etch stop layer 52 may comprise a conventional material such as silicon oxynitride (SiON) or silicon nitride (SiN).

Figure 1:
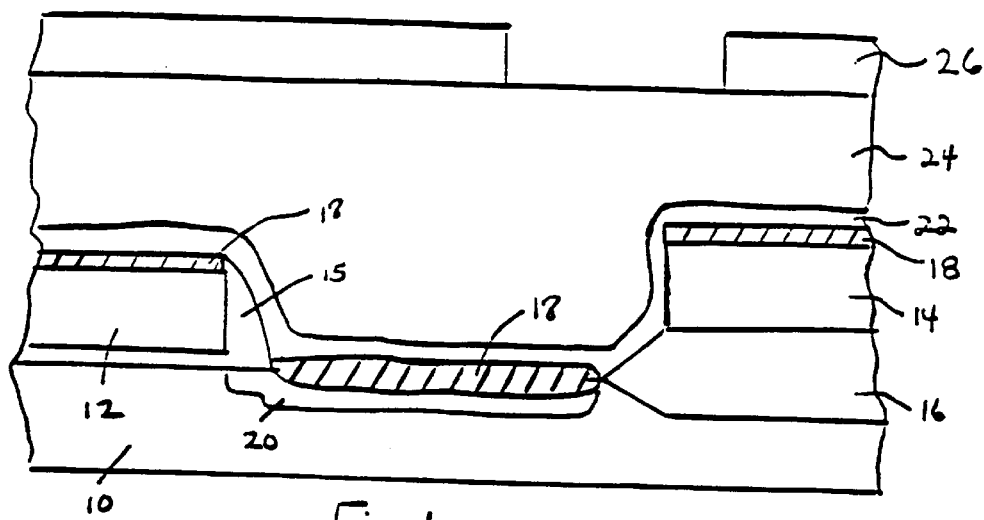
FIG. 1 depicts a cross-section of a semiconductor wafer prior to the etching of a local interconnect opening in a dielectric layer.
Figure 2:
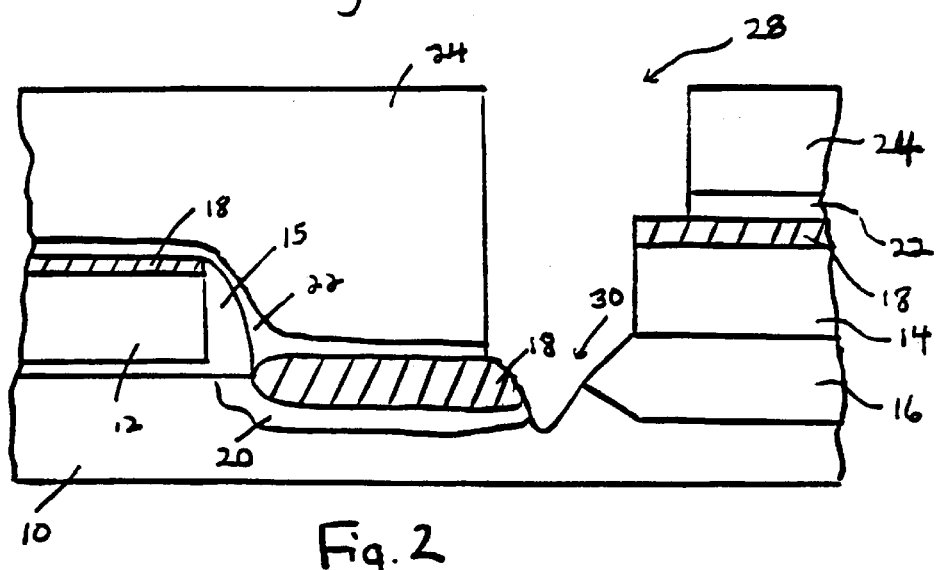
FIG. 2 depicts the cross-section of the portion of FIG. 1 following etching through of the dielectric layer and etch stop layer in accordance with conventional etching techniques.
Figure 3:
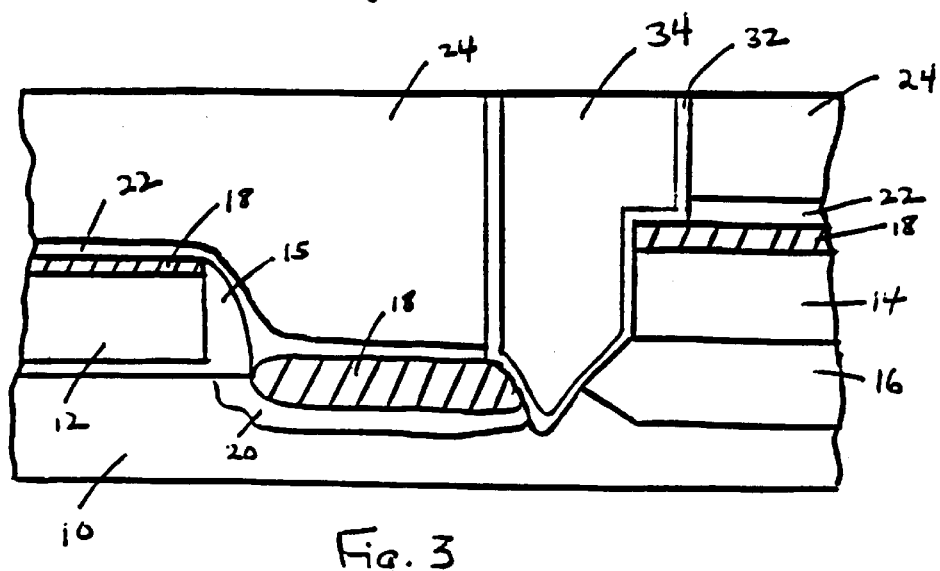
FIG. 3 depicts the formation of a local interconnect by the filling of a local interconnect opening with a barrier layer and a conductive material, and exhibits a disconnection of the diffusion region at a field edge.
Figure 9:
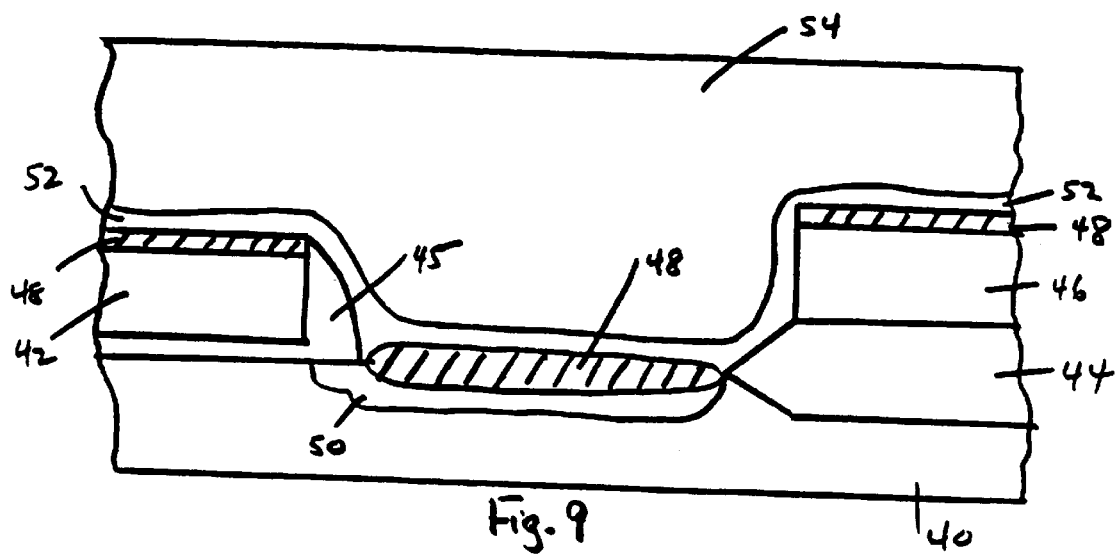
FIG. 9 depicts the cross-section of the portion of FIG. 8 after the deposition of a dielectric layer in accordance with an embodiment of the present invention.
Figure 10:
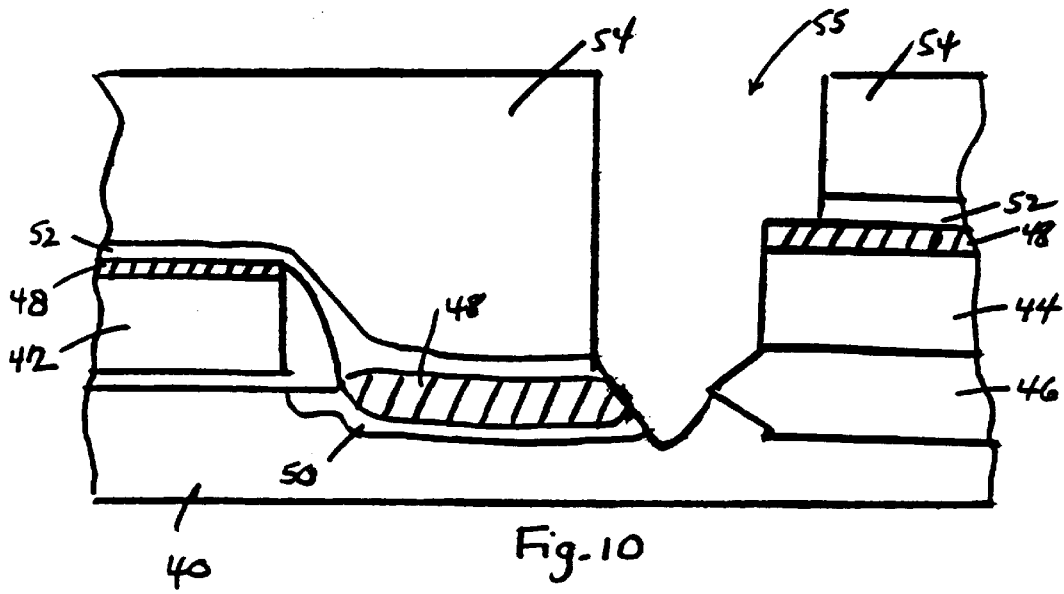
FIG. 10 depicts the cross-section of the portion of FIG. 9 after etching through of the dielectric layer and the etch stop layer in accordance with embodiments of the present invention.
Figure 11:
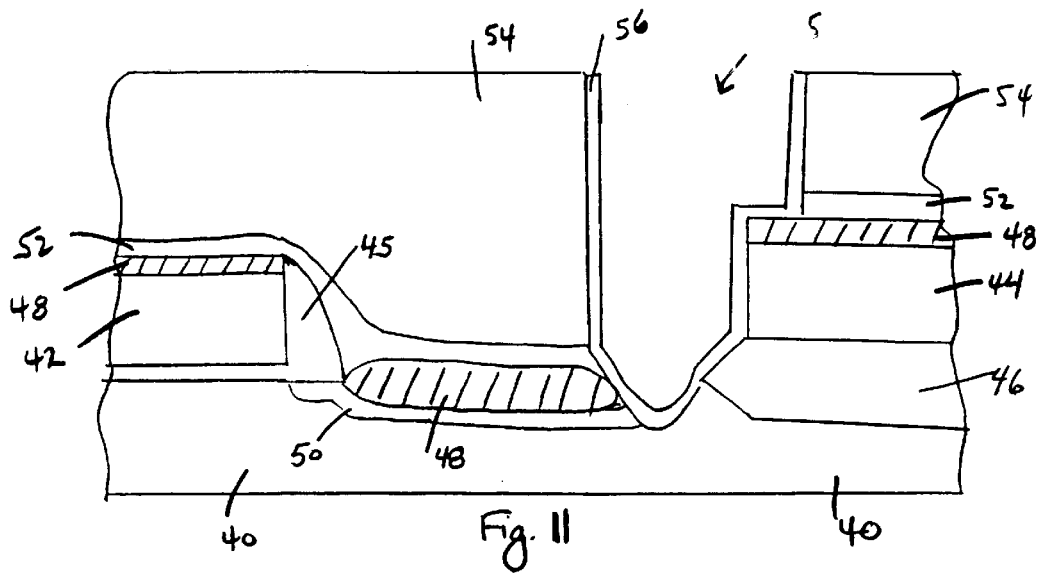
FIG. 11 is a cross-section of the portion of FIG. 10 following the deposition of a barrier layer within the local interconnect opening in accordance with embodiments of the present invention.

FIG. 9 depicts the portion of the semiconductor wafer of FIG. 8 after a dielectric layer 54 has been deposited thereon. The dielectric layer 54 may be a silicon dioxide derived from tetraethyl orthosilicate (TEOS) that is conformally deposited over the etch stop layer 52 and then planarized. Following the deposition and planarization of the dielectric layer 54, a photoresist layer is deposited, patterned and developed on the dielectric layer 54 with an opening through which the local interconnect opening is to be etched in the dielectric layer 54. However, this is not shown for purposes of explanation. The dielectric layer is then etched with a first etchant chemistry such as $CHF_3$, that etches the dielectric layer 54 and stops on the etch stop layer 52. One of the problems with the etching, however, is that conventional materials in the etch stop layer often do not have enough etch selectivity to assure prevention of a disconnection of the diffusion region at a field edge, as earlier described in FIGS. 1–3. Hence the resulting etching produces a structure as depicted in FIG. 10. The local interconnect opening 55 is through the silicide region 48 and the junction 50. The depth of a contact hole 55 thus extends into the substrate 40 to a depth that is greater than the depth of the junction 50. This reduces yield and shorts the device to the substrate 40.

A barrier layer 56 is deposited within the local interconnect opening 55. The barrier layer may be a conventional material, such as titanium nitride. The barrier layer 56 prevents the diffusion of subsequently deposited conductive material to other areas of the semiconductor wafer.

Figure 12:
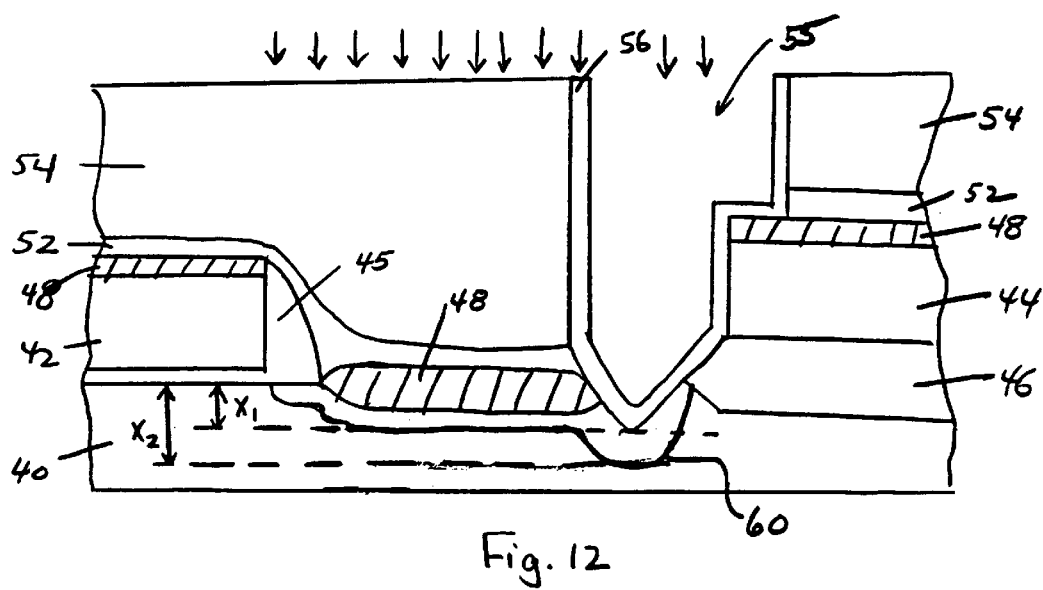
FIG. 12 is a cross-section of the portion of FIG. 11 after the implantation of additional ions into the junctions of the semiconductor device to increase the junction depths in accordance with embodiments of the present invention.

The present invention now provides an additional ion implantation step in order to increase the depth of the junction 50. As shown in FIG. 12, a second set of ions is implanted to create a deeper junction 60. The same type of ions that were implanted earlier may be implanted in the step represented by FIG. 12. However, the implantation energy is greater in order to implant the ions at a greater depth than that employed in the earlier implantation step. For example, the implantation energies in this additional implantation step may be between 45 and about 120 keV. The depths of the junction 60 (reference $X_2$ in FIG. 12) is greater than the depth ($X_1$) of the local interconnect opening 55 in the substrate 40. By providing the additional ion implantation step only after the contact etch has been performed, it is assured that the depth of a junction 60 will be greater than the depth of the contact or local interconnect 55. In preferred embodiments of the present invention, the ion implantation is performed after the barrier metal deposition since there is a pre-sputter etch normally associated with barrier metal deposition.

Figure 13:
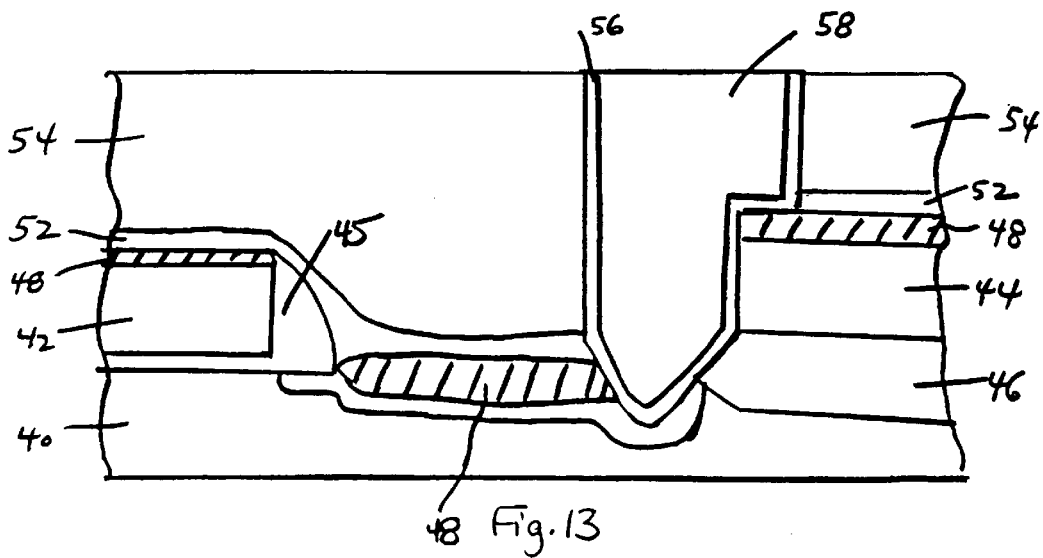
FIG. 13 depicts the cross-section of the portion of FIG. 12 after a conductive material has been deposited within the local interconnect opening in accordance with an embodiment of the present invention.

FIG. 13 is a cross-section of the portion of FIG. 12 after the deposition of a conductive material 58 within the local interconnect opening. The local interconnect structure formed by the conductive material 58 makes electrical contact, through the barrier layer 56, with the silicide regions 48 over the diffusion region 50 and the polysilicon gate 44 respectively. As seen from this figure, the local interconnect structure does not extend below the junction 60.

The present invention prevents shorts of the device to a substrate caused by a contact etch that extends through a junction and is deeper than the junction depth. This has the advantageous effect of increasing the yield in comparison to arrangements in which a conventional number of implantation steps are performed.

Although the present invention has been described and illustrated in detail, it is to be clearly understood that the same is by way of illustration and example only an is not to be taken by way of limitation, the spirit and scope of the present invention being limited only by the terms of the appended claims.

What is claimed is:

1. A method of forming a local interconnect, comprising the steps of:
    implanting ions within a semiconductor substrate to form active regions within the substrate;
    depositing a dielectric layer over the substrate;
    etching the dielectric layer in accordance with a desired pattern to form a local interconnect opening;
    forming a barrier layer within the local interconnect opening;
    implanting additional ions through the barrier layer and within the semiconductor substrate to enlarge the active regions; and
    depositing conductive material in the local interconnect opening.

2. The method of claim 1, wherein the active region is enlarged such that the depth of the active region in the substrate is greater than the depth of the local interconnect opening etched in the substrate during the etching of the dielectric layer.

3. The method of claim 2, wherein the step of implanting ions and the step of implanting additional ions include implanting at least one of boron or phosphorous ions.

4. The method of claim 2, wherein the step of implanting ions includes implanting the ions with an energy between about 20 KeV and about 60 KeV.

5. The method of claim 4, wherein the step of implanting additional ions includes implanting the additional ions with an energy between about 45 and about 120 KeV.

6. The method of claim 5, wherein the depth of the enlarged active region is greater than about 200 Angstroms.

* * * * *